Figure 1:
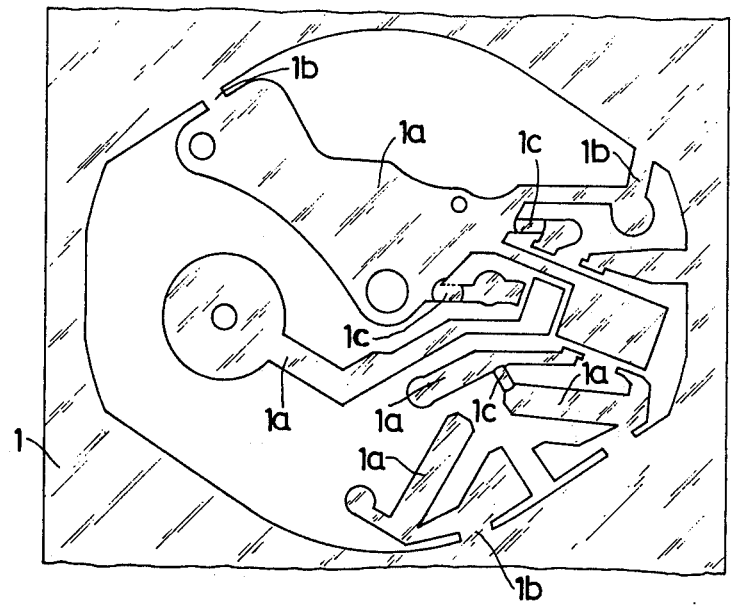

United States Patent [19]
Meister et al.

[11] 4,024,677
[45] May 24, 1977

[54] METHOD OF MANUFACTURING AN ELECTRIC TIMEPIECE AND ELECTRIC TIMEPIECE OBTAINED BY CARRYING OUT THIS METHOD

[75] Inventors: René Meister, Neuchatel; Alain Tyrode, Saint-Aubin, both of Switzerland

[73] Assignee: Ebauches S.A., Switzerland

[22] Filed: May 7, 1975

[21] Appl. No.: 575,368

[30] Foreign Application Priority Data

May 24, 1974 Switzerland .................... 7115/74

[52] U.S. Cl. .................... 58/23 R; 29/177; 58/52 R; 58/55; 58/104

[51] Int. Cl.² .................... B23P 13/00; G04C 3/00; G04B 29/02; G04B 27/00

[58] Field of Search .......... 29/177; 58/23 R, 23 A, 58/52 R, 52 A, 55, 104

[56] References Cited

UNITED STATES PATENTS

| | | | |
|---|---|---|---|
| 3,672,155 | 6/1972 | Bergey et al. | 58/50 R |
| 3,676,993 | 7/1972 | Bergey et al. | 58/23 R |
| 3,778,999 | 12/1973 | Vuffray | 58/23 R |

*Primary Examiner*—E. S. Jackmon
*Attorney, Agent, or Firm*—Silverman & Cass, Ltd.

[57] ABSTRACT

An electric timepiece has a metallic grid cut from a sheet of metallic material with portions of the grid utilized for connecting the electronic circuit and other portions of the grid utilized for mechanical elements of the timepiece movement. Plastic material is overmoulded on the metallic grid to support the electronic circuit. An element of the frame of movement of the timepiece is formed by a second overmoulding of the overmoulded metallic grid.

5 Claims, 3 Drawing Figures

METHOD OF MANUFACTURING AN ELECTRIC TIMEPIECE AND ELECTRIC TIMEPIECE OBTAINED BY CARRYING OUT THIS METHOD

The present invention has for an object a method of manufacturing an electric timepiece comprising an electric circuit and the electric timepiece obtained by carrying out this method.

The manufacture of electronic circuits needs operations which are relatively complicated so that there are several methods which are carried out to this effect.

In the case of circuits intended to be used in timepieces, the question is still complicated for the reason that the support of the circuit comprises also mechanical elements of the movement.

The purpose of the present invention is to permit the realization of such a timepiece, more precisely of its electronic circuit comprising mechanical elements of the movement, which be simple, cheap and at the same time reliable.

To this effect, the method according to the invention is characterized by the fact that the support of the electronic circuit of the timepiece is obtained by overmoulding of plastic material on a metallic grid, a portion of said grid being used for elements of connnection of the circuit and portion for mechanical elements of the movement In a preferrrd mode of carrying out this method, one obtain at least an element of the frame of the movement by a second operation of overmoulding of plastic material effected on the first moulded member.

The timepiece obtained by carrying out this method is characterized by the fact that the support of its electric circuit constitutes at least an element of the frame of its movement.

The drawing illustrates, by way of example, one mode of carrying out the method according to the invention.

Figure 2:
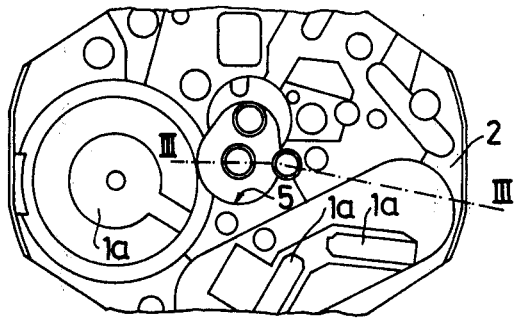
Figure 3:
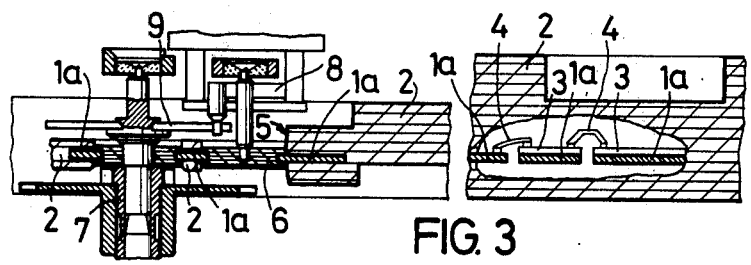

FIGS. 1 and 2 are plane views of a portion of an electronic timepiece, in tow different phases of its manfacture, and FIG. 3 is a sectional view along line III—III of FIG. 2, at a larger scale.

The electronic circuit of the present timepiece is obtained as follows: First, one cuts a metallic sheet 1, that provides therein elements 1a of a grid; these elements are connected to each other during the manufacture, as shown by FIG. 1, but are intended to be separated from each other by a further cutting operation of the binding elements such as 1b connecting the said elements to the rest of the plate, or of the bindings such as 1c connecting to each other some elements 1a which must finally be separated.

One obtains the support of the electronic circuit by overmoulding plastic material 2 on the grid such as it appears in FIG. 1, that gives, after cutting off the bindings 1b and 1c of the grid, the member such as represented in FIG. 2.

It is to be noted that one can also, before effecting the overmoulding of the support 2, carry out the mounting, on the elements 1a of the grid, by sticking or welding, of the integrated circuits, of discrete electronic components, such as transistors, capacities or others, or still of thick or thin coating circuits, which would then be embedded in the material 2 during the operation of overmoulding this latter. These several elements are then electrically connected to the grid. Thus, in FIG. 3, discrete components 3 are visible, which are connected to elements 1a of the grid by elements 4 of electric connection.

The overmoulded support 2 is provided with openings which are relatively large, such as opening 5, in which may be obtained by a second overmoulding operation, by means of plastic material 6, at least one element of the frame of the movement. In the example as disclosed and represented, the overmoulding portion 6 serves to support for instance the cannon-pinion 7 of the movement, the pallets of counting 8 and the counting wheel 9 which is operated by the said pallets.

Thus, in the present case, the twice overmoulded member 2–6, containing the grid of the electronic circuit, constitutes the baseplate of the movement.

The elements 1a of the grid do not constitute only the elements of the electronic circuit, but also mechanic elements of the movement such as return springs, bearings, balance wheels, whips, etc.; one realizes this way, simultaneously and during a sole and same operation, during the cutting of the sheet 1, on the one hand elements of the electronic circuit and on the other hand mechanical elements of the movement.

What we claim is:

1. A method of manufacturing an electronic timepiece having a frame of movement, mechanical elements and an electronic circuit comprising:
    forming a metallic grid by cutting out portions of said grid from a metallic sheet;
    forming at least one connection element for said electronic circuit from a first portion of said grid;
    forming at least one mechanical element for said timepiece from a second portion of said grid; and
    forming a support for said electronic circuit by overmoulding plastic material on said metallic grid portions, said support including at leat one open portion.

2. A method as claimed in claim 1 further including:
    forming at least one element of said frame of movement by second a overmoulding of plastic material on said support including at least part of said open portion.

3. An electronic timepiece having a frame of movement, mechanical elements, a baseplate and an electronc circuit, comprising:
    a metallic grid, at least a first portion of said grid forming a connecting element of said electronic circuit, at least a second portion of said grid forming mechanical element of said timepiece;
    said grid being overmoulded by plastic material to form a support for said electronic circuit, said support including at least one open portion.

4. An electronic timepiece as claimed in claim 3, wherein:
    at least one element of said frame of movement is formed by a second overmoulding of plastic material on said support including at least part of said open portion; and
    said support includes at least an element of said frame of movement.

5. A timepiece as claimed in claim 4, wherein:
    said support of said electronic circuit is the baseplate of said timepiece movement.

* * * * *